(12) United States Patent
Aoyagi (10) Patent No.: US 8,184,480 B2
(45) Date of Patent: May 22, 2012

(54) MULTI-LEVEL NONVOLATILE MEMORY DEVICE WITH REDUCED NUMBER OF READ VOLTAGES BASED ON A CELL ADDRESS AND METHOD FOR OPERATING THE SAME

(75) Inventor: Yousuke Aoyagi, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 349 days.

(21) Appl. No.: 12/654,063

(22) Filed: Dec. 9, 2009

(65) Prior Publication Data

US 2010/0149872 A1    Jun. 17, 2010

(30) Foreign Application Priority Data

Dec. 11, 2008  (JP) ................................. 2008-315865
Sep. 7, 2009   (KR) ......................... 10-2009-0084029

(51) Int. Cl.
*G11C 16/04* (2006.01)

(52) U.S. Cl. .............................. 365/185.03; 365/185.18

(58) Field of Classification Search ............. 365/185.03, 365/185.11, 185.18
See application file for complete search history.

(56) References Cited

U.S. PATENT DOCUMENTS

| 7,035,144 B2 | 4/2006 | Kim et al. | |
|---|---|---|---|
| 7,729,175 B2 * | 6/2010 | Cho et al. | 365/185.24 |
| 7,974,139 B2 * | 7/2011 | Kim et al. | 365/189.09 |
| 2011/0292726 A1 * | 12/2011 | Lee et al. | 365/185.03 |

FOREIGN PATENT DOCUMENTS

JP    2005-032431 A    2/2005

* cited by examiner

*Primary Examiner* — Andrew Q Tran
(74) *Attorney, Agent, or Firm* — Lee & Morse, P.C.

(57) ABSTRACT

Methods for operating a nonvolatile memory device including multi-level cells configured to store at least n logic states, where n is equal to or greater than four are provided. The methods may include selecting at least one read voltage for a read operation based on information set at a portion of an address of the respective one of the multi-level cells, and determining multi-level data stored in the respective multi-level cell using the at least one selected read voltage.

20 Claims, 5 Drawing Sheets

MULTI-LEVEL NONVOLATILE MEMORY DEVICE WITH REDUCED NUMBER OF READ VOLTAGES BASED ON A CELL ADDRESS AND METHOD FOR OPERATING THE SAME

BACKGROUND

1. Field

Embodiments relate to a memory device. More particularly, embodiments relate to a data read method for a multi-level cell memory employable for reading, e.g., 2-bit data.

2. Description of the Related Art

Extensive research is being conducted on multi-level cells to increase the integration density of nonvolatile memory devices. Multi-level cells are memory elements that are adapted to store more than a single bit of data. A multi-level cell may have a plurality of read windows, e.g., three read windows, which may be distinguished based on a plurality of threshold voltage states, e.g., four threshold voltage states for 2 bit data. In such multi-level memory cells, during a read operation, a data read voltage corresponding to at least three of the first, second, third and fourth threshold voltage states is sequentially applied and current flow or a lack thereof may be determined, respectively. Therefore, in such embodiments, during each data read operation, time must be allocated for each of the at least three sequential data read voltage states.

SUMMARY

Embodiments are therefore directed to a multi-level cell memory device and a reading method thereof, which substantially overcome one or more of the problems due to the limitations and disadvantages of the related art.

It is therefore a feature of an embodiment to provide a multi-level memory cell that is adapted to reduce a time period of a read operation, i.e., increase reading speed.

It is therefore a separate feature of an embodiment to provide a data reading method that is adapted to reduce a time period and/or a number of read voltage applications during a read operation.

It is therefore a separate feature of an embodiment to provide a method of reading data stored in multi-level cells of a nonvolatile memory device based on one or more read voltages selected during a read operation based on information set at a portion of an address of the respective multi-level cell being read.

At least one of the above and other features and advantages may be realized by providing a method for operating a nonvolatile memory device including multi-level cells configured to store at least n logic states, where n is equal to or greater than four, the method including selecting at least one read voltage for a read operation based on information set at a portion of an address of the respective one of the multi-level cells, and determining multi-level data stored in the respective multi-level cell using the at least one selected read voltage.

Selecting at least one read voltage may include selecting only one read voltage for the read operation of the respective one of the multi-level cells, and determining multi-level data may include determining the multi-level data stored in the respective multi-level cell using the one selected read voltage.

Selecting at least one read voltage may include selecting only up to n/2 read voltages for the read operation of the respective one of the multi-level cells, and determining multi-level data may include determining the multi-level data stored in the respective multi-level cell using the up to n/2 selected read voltages.

A first voltage interval may be between a first threshold voltage and a second threshold voltage, a second voltage interval may be between the second threshold voltage and a third threshold voltage, and a third voltage interval may be between the third threshold voltage and a fourth threshold voltage, and selecting at least one read voltage may include selecting a read voltage from only odd or even ones of the first, second and third voltage intervals based on the information set at the portion of the address of the respective one of the multi-level cells.

The first logic state may correspond to the first threshold voltage, the second logic state may correspond to the second threshold voltage, the third logic state may correspond to the third threshold voltage, and the fourth logic state may correspond to the fourth threshold voltage, and the second threshold voltage may be greater than the first threshold voltage, the third threshold voltage may be greater than the second threshold voltage and the fourth threshold voltage may be greater than the third threshold voltage.

N may be equal to 4.

The n logic states may correspond to n sequential voltage intervals, respectively, and selecting at least one read voltage may include only selecting a respective read voltage from one or more of non-neighboring ones of the n sequential voltage intervals.

Selecting at least one read voltage may include selecting a read voltage corresponding to a level between the second logic state and the third logic state when a level of the information set at the portion of the address is a first level.

Selecting at least one read voltage may include selecting a read voltage corresponding to a level between the first logic state and the second logic state and/or a read voltage corresponding to level between the third logic state and the fourth logic state when a level of the information set at the portion of the address is a second level.

The information set at the portion of the address of the respective multi-level cell may correspond to at least one of a first level and a second level, and when the information is set at the first level selecting at least one read voltage may include selecting one or more read voltages from a first set of voltage intervals corresponding to the n logic states, respectively, and when the information is set at the second level selecting at least one read voltage may include selecting one or more read voltages from a second set of voltage intervals corresponding to the n logic states, the first set of voltage intervals being different from the second set of voltage intervals.

The method may include setting the information at the portion of the address during a program operation based on multi-level data to be programmed, respectively.

Setting the information at the portion of the address may include setting the information to a first level when the multi-level data corresponds to the second logic state or the third logic state.

Setting the information at the portion of the address may include setting the information to a second level when the multi-level data corresponds to the first logic state or the fourth logic state.

The first logic state, the second logic state, the third logic state and the fourth logic state may have an ascending order relationship.

At least one of the above and other features and advantages may also be realized by providing a nonvolatile memory device, including a memory cell array including multi-level cells configured to store n logic states, where n is equal to or greater than four, an address decoder configured to decode addresses selecting the multi-level cells, respectively, and a read voltage generation circuit configured to provide respective read voltages to the memory cell array, wherein the read voltage generation circuit selects at least one read voltage based on information set at a portion of the respective address decoded by the address decoder for a respective one of the multi-level cells, and multi-level data stored in the respective multi-level cells is determined based on the at least one selected read voltage.

N may be equal to four. Each of the multi-level cells may be adapted to store 2 bit data.

At least one of the above and other features and advantages may also be realized by providing a method for operating a nonvolatile memory device including multi-level cells configured to store at least n logic states, where n is equal to or greater than four, and the n logic states including a first set of logic states and a second set of logic states, the method may include setting information of a first level or a second level at a portion of a respective address selecting a respective one of the multi-level cells when the respective multi-level cell is set with a logic state from the first set or the second set of logic states, respectively, determining the level of the information set at the portion of the respective address during a respective data read operation, and reading multi-level data stored in the multi-level cell by applying at least one read voltage selected based on the level of the information set at the respective portion of the address of the respective one of the multi-level cells.

The first set of logic states of the n-logic states may be distinct from the second set of logic states of the n-logic states, the level of information is one of a first level or a second level, and a read voltage set corresponding to the one or more read voltages selected when the level of information is at the first level is different a read voltage set corresponding to the one or more read voltages selected when the level of information is at the second level.

N may be equal to four, setting information may include setting information to the first level when the respective multi-level cell is set with one of the second logic state or the third logic state and to the second level when the respective multi-level cell is set with one of the first logic state and the fourth logic state, and reading multi-level data may include applying a read voltage corresponding to a level between the second logic state and the third logic state when the information has the first level and sequentially applying a read voltage corresponding to a level between the first logic state and the second logic state and a read voltage corresponding to a level between the third logic state and the fourth logic state when the information has the second level.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Japanese Patent Application No. 2008-315865, filed on Dec. 11, 2008, in the Japanese Intellectual Property Office, and Korean Patent Application No. 10-2009-0084029, filed on Sep. 7, 2009, in the Korean Intellectual Property Office, are incorporated by reference herein in their entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In addition, it will be understood that when an element is referred to as being "connected to" a second element, the element may be directly and/or indirectly connected to the second element via one or more intervening elements. Like reference numerals refer to like elements throughout the specification.

Hereinafter, the term 'multi-level data' denotes data that is stored in a multi-level cell. For example, when n-bit data is stored in a multi-level cell, the term 'multi-level data' denotes the n-bit data. For example, when 2-bit data is stored in a multi-level cell, the multi-level data may be '11', '10', '00', or '01'.

Figure 1A:
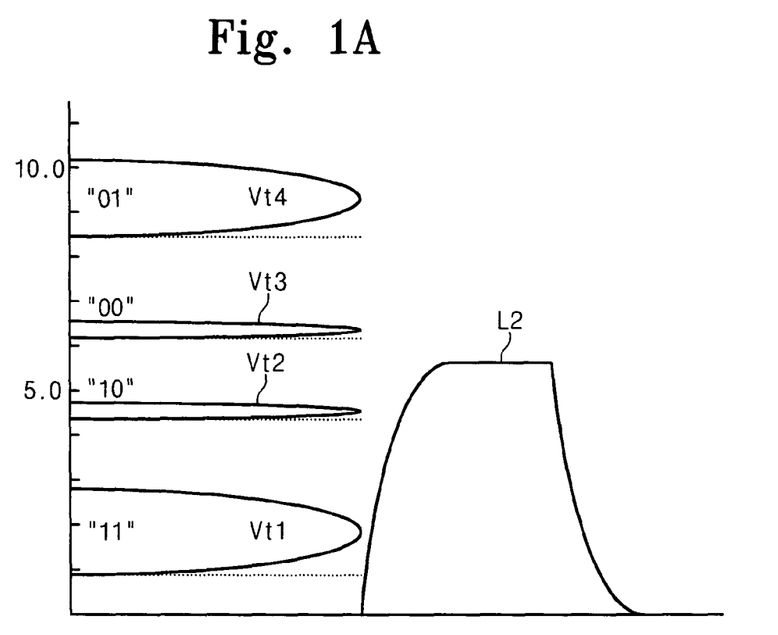
FIG. 1A and FIG. 1B illustrate a diagram of exemplary threshold voltage distribution and exemplary data read voltages employable with a 2-bit multi-level memory cell according to an exemplary embodiment.
Figure 1B:
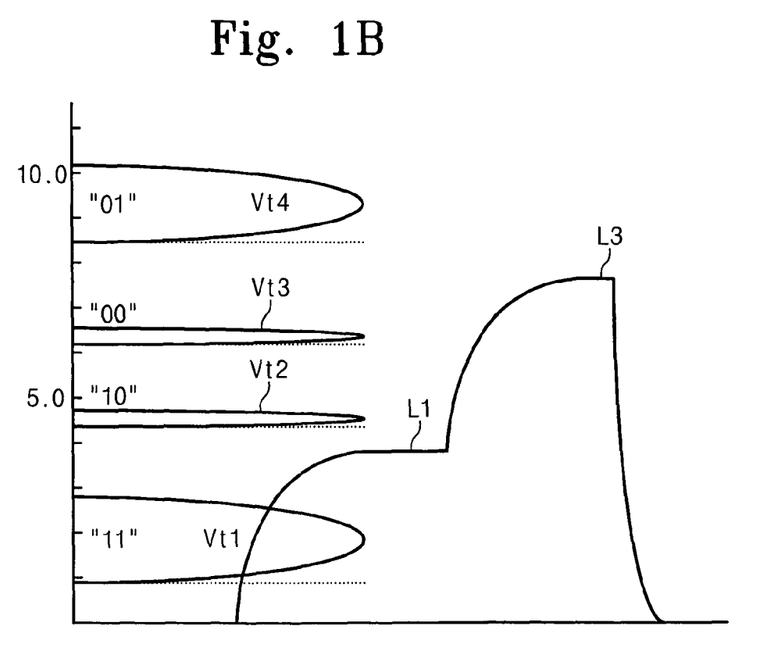

FIG. 1A and FIG. 1B illustrate a diagram of exemplary threshold voltage distribution and exemplary data read voltages employable with a 2-bit multi-level memory cell according to an exemplary embodiment.

Referring to FIGS. 1A and 1B, a threshold voltage distribution of the multi-level cell may include a first threshold voltage Vt1, a second threshold voltage Vt2, a third threshold voltage Vt3, and a fourth threshold voltage Vt4. The second threshold voltage may be greater than the first threshold voltage, the third threshold voltage may be greater than the second threshold voltage, and the fourth threshold voltage may be greater than the third threshold voltage, i.e., may be in ascending order.

As shown in FIGS. 1A and 1B, a threshold voltage range corresponding to the first threshold voltage Vt1 may be defined as a first logic state, a threshold voltage range corresponding to the second threshold voltage Vt2 may be defined as a second logic state, a threshold voltage range corresponding to the third threshold voltage Vt3 may be defined as a third logic state, and a threshold voltage range corresponding to the fourth threshold voltage Vt4 may be defined as a fourth logic state.

More particularly, in such embodiments, a specific reference voltage may represent each of the logic states. For example, the first to fourth threshold voltages Vt1, Vt2, Vt3, and Vt4 may be reference threshold voltages corresponding to the first to fourth logic states, respectively. More particularly, e.g., the first to fourth threshold voltages Vt1, Vt2, Vt3, and Vt4 may respectively be verify voltages for programming such memory cells into the first to fourth logic states. Hereinafter, the threshold voltage ranges corresponding to the first, second, third and fourth logic states will be referred to as the first, second, third and fourth threshold voltages Vt1, Vt2, Vt3, and Vt4, respectively.

The first to fourth threshold voltages Vt1, Vt2, Vt3 and Vt4 may correspond to data '11', '10', '00' and '01', respectively.

In such embodiments, the data read voltage may have a first level L1, a second level L2, a third level L3, and a fourth level L4 in ascending order of the levels. The first level L1 may correspond to a level between the first threshold voltage Vt1 and the second threshold voltage Vt2, the second level L2 may correspond to a level between the second threshold voltage Vt2 and the third threshold voltage Vt3, the third level L3 may correspond to a level between the third threshold voltage Vt3 and the fourth threshold voltage Vt4, and the fourth level L4 may correspond to a level of the fourth threshold voltage Vt4 or greater.

In embodiments, when one of the above threshold voltages is set in write data for a selected multi-level cell, information corresponding to the set threshold voltage may be set at a portion of an address selecting the multi-level cell.

More particularly, e.g., an address selecting a respective multi-level cell may include A0 to A7 bits. In such embodiments, e.g., the A0 and A2 bits may be allocated to set a page address. The A3 bit may be used to set information corresponding to a set threshold voltage. When the second threshold voltage Vt2 or the third threshold voltage Vt3 is set as the threshold voltage of the respective multi-level cell, a 'H' level may be set at the corresponding A3 bit. When the first threshold voltage Vt1 or the fourth threshold voltage Vt4 is set as the threshold voltage of the respective multi-level cell, a 'L' level may be set at the corresponding A3 bit.

In such embodiments, during a data read operation, when a read multi-level cell is selected, the content of the A3 bit of the address selecting the respective multi-level cell may be determined. When the content of the A3 bit is a 'H' level, the threshold voltage set in the respective multi-level cell may be the second threshold voltage Vt2 or the third threshold voltage Vt3. Thus, as illustrated in FIG. 1A, the data read voltage of the second level L2 corresponding to the level between the second threshold voltage Vt2 and the third threshold voltage Vt3 may be applied to the respective multi-level cell to determine the threshold voltage of the respective multi-level cell. That is, if the threshold voltage of the respective multi-level cell is set to correspond to the second threshold voltage Vt2, a current may flow in the respective multi-level cell when the data read voltage of the second level L2 is applied thereto. If current flows when the data read voltage of the second level is applied, the threshold voltage of the respective multi-level cell may be determined to be the second threshold voltage Vt2, and the read data may be determined to be '10'. If the threshold voltage of the respective multi-level cell is set to the third threshold voltage Vt3, a current should not flow in the multi-level cell even when the data read voltage of the second level L2 is applied thereto. If current does not flow when the data read voltage of the second level is applied, the threshold voltage of the multi-level cell may be determined to be the third threshold voltage Vt3, and the read data may be determined to be '00'.

When the content of the A3 bit is a 'L' level, the threshold voltage set in the respective multi-level cell may be the first threshold voltage Vt1 or the fourth threshold voltage Vt4. Thus, as illustrated in FIG. 1B, the data read voltage of the first level L1 (corresponding to the level between the first threshold voltage Vt1 and the second threshold voltage Vt2) and the data read voltage of the third level L3 (corresponding to the level between the third threshold voltage Vt3 and the fourth threshold voltage Vt4) may be sequentially applied to the multi-level cell to determine the threshold voltage of the multi-level cell. If the threshold voltage of the respective multi-level cell is set to the first threshold voltage Vt1, a current should flow in the respective multi-level cell when the data read voltage of the first level L1 is applied thereto. If current flows in the respective multi-level cell when the data read voltage of the first level L1 is applied thereto, the threshold voltage of the multi-level cell may be determined to be the first threshold voltage Vt1, and the read data may be determined to be '11'. If the threshold voltage of the respective multi-level cell is set to the fourth threshold voltage Vt4, a current should not flow in the respective multi-level cell even when the data read voltage of the third level L3 is applied thereto. If current does not flow in the respective multi-level cell when the data read voltage of the third level L3 is applied to the respective multi-level cell, the threshold voltage of the respective multi-level cell may be determined to be the third threshold voltage Vt3, and the read data may be determined to be '01'.

In embodiments, as discussed above, e.g., multi-level data may be read using a reduced number of read voltage applications relative to comparable conventional memory devices and/or reading methods. More particularly, embodiments may be adapted to utilize information set in a portion of a cell selection address to reduce a number of required read voltage applications relative to comparable conventional devices. For example, embodiments related to a two-bit multi-level memory cell may be adapted to determine a threshold voltage of the two-bit multi-level cell using no more than two read voltage applications on the basis of information set in a portion of the cell selection address. More particularly, in embodiments, e.g., in the case of a two-bit multi-level cell, by employing information set in a portion of a cell selection address of the multi-level cell, a single read voltage application or two read voltage applications may be sufficient to complete a read operation for the respective multi-level cell. For example, in embodiments assuming n voltage states, n/2 or fewer data read voltage applications may be sufficient to complete a read operation for the respective multi-level cell. That is, e.g., in an embodiment where n is equal to four, only 2 or fewer data read voltages may be selectively employed to determine multi-level data stored in the respective multi-level cell.

That is, e.g., referring to the exemplary embodiment of FIG. 1B, when the content of the A3 bit is a 'L' level, an analysis of the respective read operation may be reduced to a determination between the first threshold voltage Vt1 and the fourth threshold voltage Vt4, and a determination pertaining to the second threshold voltage Vt2 and the third threshold voltage Vt3 may not be performed. Accordingly, in some embodiments, e.g., depending on whether the content of the A3 bit is a level or a 'H' level, selected data read voltages may only fall within even or odd ones of voltage intervals. For example, it may be assumed that a first voltage interval may be below the first threshold voltage Vt1, a second voltage interval may be between the first threshold voltage Vt1 and the second threshold voltage Vt2, a third voltage interval may be between the second threshold voltage Vt2 and the third threshold voltage Vt3, and a fourth voltage interval may be between the third threshold voltage Vt3 and the fourth threshold voltage Vt4, and a fifth voltage interval may be greater than the fourth threshold voltage Vt4. With such an exemplary characterization of the voltage intervals, in the exemplary embodiment of FIGS. 1A and 1B, when the content of the A3 bit is a 'H', the selected data read voltage is selected only from odd ones of the voltage intervals, e.g., the third voltage interval, and when the content of the A3 bit is a 'L', the selected data read voltage is selected only from even ones of the voltage intervals, e.g., the second and the fourth voltage intervals.

Accordingly, embodiments may enable a read time to be reduced relative to comparable conventional memory devices and/or reading methods.

Further, in some embodiments, e.g., the exemplary embodiment of FIG. 1A, when the content of the A3 bit is a 'H' level and the determination pertaining to the second threshold voltage Vt2 and the third threshold voltage Vt3 may be performed, a data read voltage of the second level L2 may only be applied one time. Thus, if necessary, additional time may instead be allocated to ensuring that the respective data read voltage is set to an accurate level. In such embodiments, even if additional time is allocated to ensuring the respective data read voltage is set to an accurate level, not only may accuracy improve, a read time may still be reduced relative to comparable conventional memory device. Accordingly, embodiments may enable an accurate threshold voltage determination to be made even in when an interval between the respective threshold voltages, e.g., the second threshold voltage Vt2 and the third threshold voltage Vt3 is small.

Embodiments may enable accurate threshold voltage determination to be performed even when a respective range of the threshold voltages, e.g., the range of the second threshold voltage Vt2 and the range of the third threshold voltage Vt3, increases and the interval between the respective threshold voltages, e.g., the second threshold voltage Vt2 and the third threshold voltage Vt3, decreases.

Figure 2:
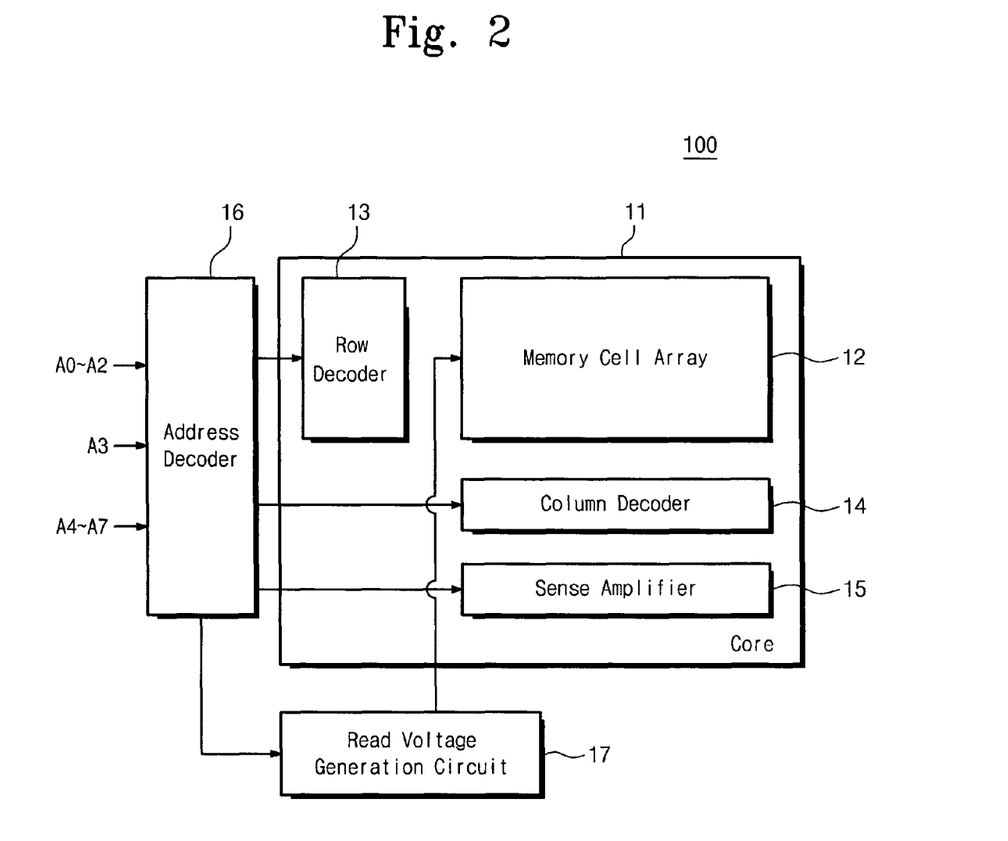
FIG. 2 illustrates a block diagram of an exemplary embodiment of a nonvolatile memory device implementing a data read method.

FIG. 2 illustrates a block diagram of an exemplary embodiment of a nonvolatile memory device 100 implementing a data read method.

Referring to FIG. 2, the nonvolatile memory device 100 may include a core 11, and an address decoder 16, and a read voltage generation circuit 17. The core 11 may include a memory cell array 12, a row decoder 13, a column decoder 14, and a sense amplifier 15.

The memory cell array 12 may include a plurality of multi-level cells. Addresses A0 to A7 may be input to the address decoder 16. A respective read multi-level cell of the memory cell array 12 may be selected by the address decoder 16, the row decoder 13, and the column decoder 14. The multi-level cells may enable 2-bit data to be stored therein. The address decoder 16 may decode the content of an A3 bit among the addresses A0 to A7 and output the result to the read voltage generation circuit 17. Thus, in the exemplary embodiment of FIGS. 1A and 1B, the read voltage generation circuit 17 may generate a data read voltage of the second level L2 or a data read voltage of the first level L1 or the third level L3 according to the content of the A3 bit and may supply the generated data read voltage to the selected multi-level cell of the memory cell array. Accordingly, a data read operation according to the exemplary embodiments described above with regard to FIGS. 1A and 1B may be performed.

Figure 3:
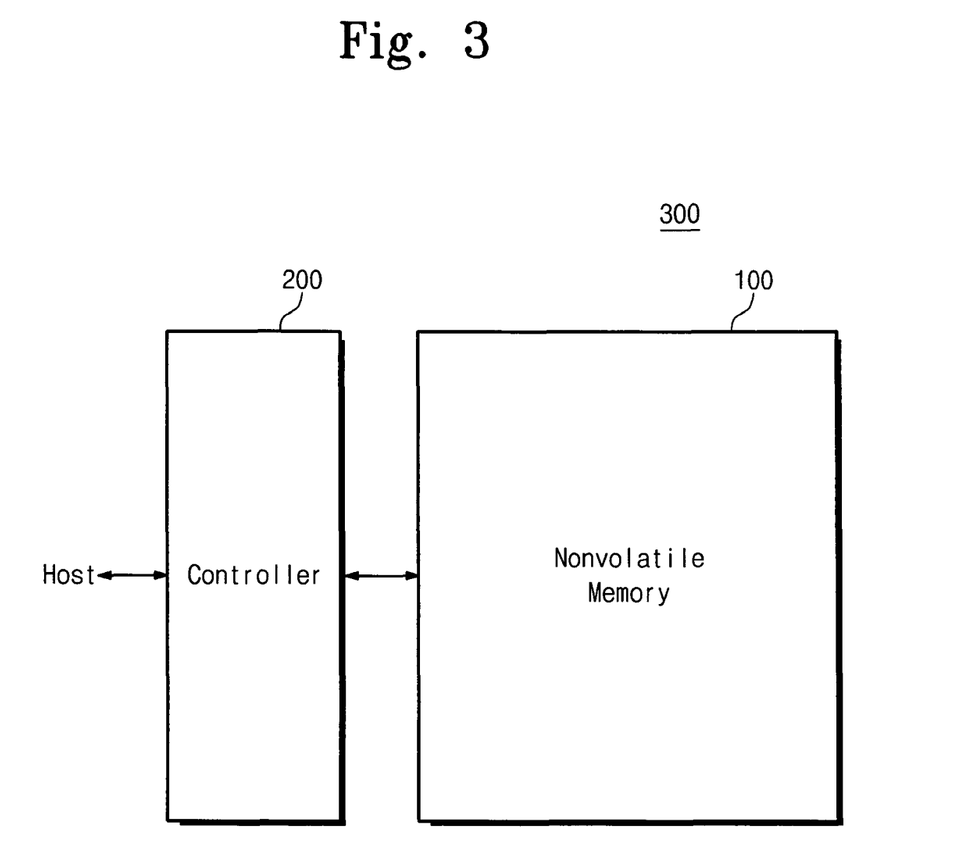
FIG. 3 illustrates a block diagram of an exemplary embodiment of a memory system including the nonvolatile memory device of FIG. 2.

FIG. 3 illustrates a block diagram of an exemplary embodiment of a memory system 300 including the nonvolatile memory device 100 of FIG. 2.

Referring to FIG. 3, the memory system 300 may include a controller 200 and the nonvolatile memory device 100.

The controller 200 may be connected to a host and the nonvolatile memory device 100. The controller 200 may be configured to access the nonvolatile memory device 100 in response a request from the host. For example, the controller 200 may be configured to control a read/write/erase operation of the nonvolatile memory device 100. The controller 1000 may be configured to provide an interface between the nonvolatile memory device 100 and the host. The controller 1000 may be configured to drive a firmware for controlling the nonvolatile memory device 100.

More particularly, e.g., the controller 200 may be configured to set a portion (e.g., an A3 bit) of an address of the nonvolatile memory device 100. For example, in the exemplary embodiment described with reference to FIGS. 1A, 1B and 2, when the second threshold voltage Vt2 or the third threshold voltage Vt3 is used as the threshold voltage of a multi-level cell during a write operation, the controller 200 may set a 'H' level at the A3 bit. In such embodiments, when the first threshold voltage Vt1 or the fourth threshold voltage Vt4 is used as the threshold voltage of a multi-level cell during a write operation, the controller 200 may set a 'L' level at the A3 bit.

During a read operation, the controller 200 may provide the nonvolatile memory device 100 with an address including the A3 bit set in the write operation. As described above with reference to FIGS. 1A, 1B and 2, the nonvolatile memory device 100 may select a read voltage on the basis of the A3 bit. The nonvolatile memory device 100 may perform a read operation on the basis of the selected read voltage.

The controller 200 may include a random access memory (RAM), a processing unit, a host interface, and a memory interface (not shown). The RAM may be used as a working memory of the processing unit. The processing unit may control an overall operation of the controller 200.

The host interface may include protocol for data exchange between the host and the controller 200. For example, the controller 200 may be configured to communicate with an external device (e.g., the host) through one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), and IDE (Integrated Drive Electronics), etc. The memory interface may interface with the nonvolatile memory device 100.

The memory system 300 may further include an error correction block (not shown). The error correction block may be configured to detect and correct an error in data read from the nonvolatile memory device 100. In some embodiments, the error correction block may be provided as a component of the controller 200. In other embodiments, e.g., the error correction block may be provided as a component of the nonvolatile memory device 100.

The controller 200 and the nonvolatile memory device 100 may be integrated into one semiconductor device. As an example, the controller 200 and the nonvolatile memory device 100 may be integrated into one semiconductor device, e.g., a memory card. More particularly, e.g., the controller 200 and the nonvolatile memory device 100 may be integrated into one semiconductor device, e.g., a PC card (e.g., PCMCIA (Personal Computer Memory Card International Association)), a compact flash card (CF), a smart media card (e.g., SM and SMC), a memory stick, a multimedia card (e.g., MMC, RS-MMC and MMCmicro), a SD card (e.g., SD, miniSD, microSD and SDHC), a universal flash storage (UFS), etc. Embodiments are not, however, limited to such devices.

For example, in some embodiments, the controller 200 and the nonvolatile memory device 100 may be integrated into one semiconductor device, e.g., a solid state drive (SSD). As an example, the SSD may include a storage device configured to store data in a semiconductor memory. When the memory system 300 is used as an SSD, an operation speed of the host connected to the memory system 300 may increase remarkably.

As another example, in some embodiments, the memory system 300 may be applicable to computers, portable computers, laptop computers, UMPCs (Ultra Mobile PCs), netbooks, PDAs, web tablets, wireless phones, mobile phones, smart phones, digital cameras, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, and/or one of various components constituting a computing system (e.g., an SSD or a memory card), etc.

As yet another example, the nonvolatile memory device 100 or the memory system 300 may be mounted in various types of packages. Examples of the packages of the nonvolatile memory device 100 or the memory system 300 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP), etc.

Figure 4:
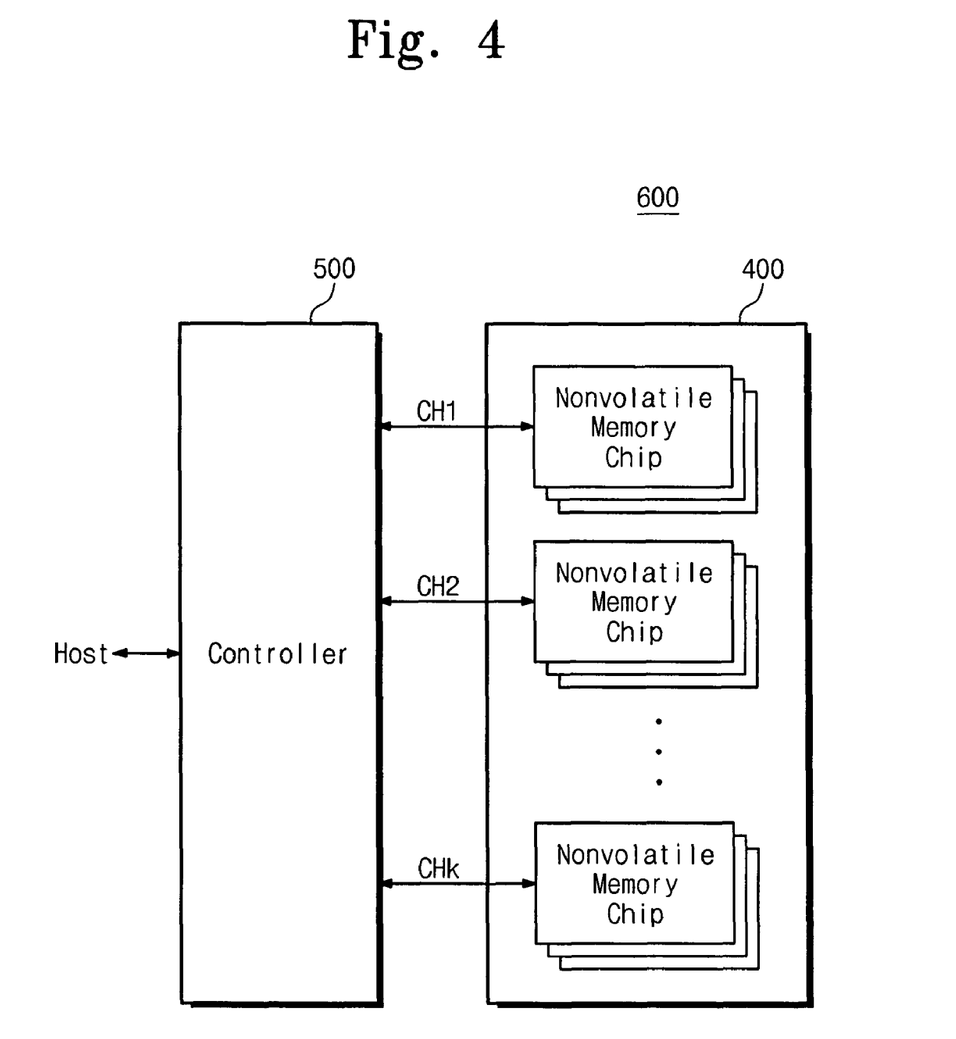
FIG. 4 illustrates a block diagram of an exemplary embodiment of a memory system including another exemplary embodiment of nonvolatile memory device.

FIG. 4 illustrates a block diagram of an exemplary embodiment of a memory system 600 including another exemplary embodiment of nonvolatile memory device.

Figure 5:
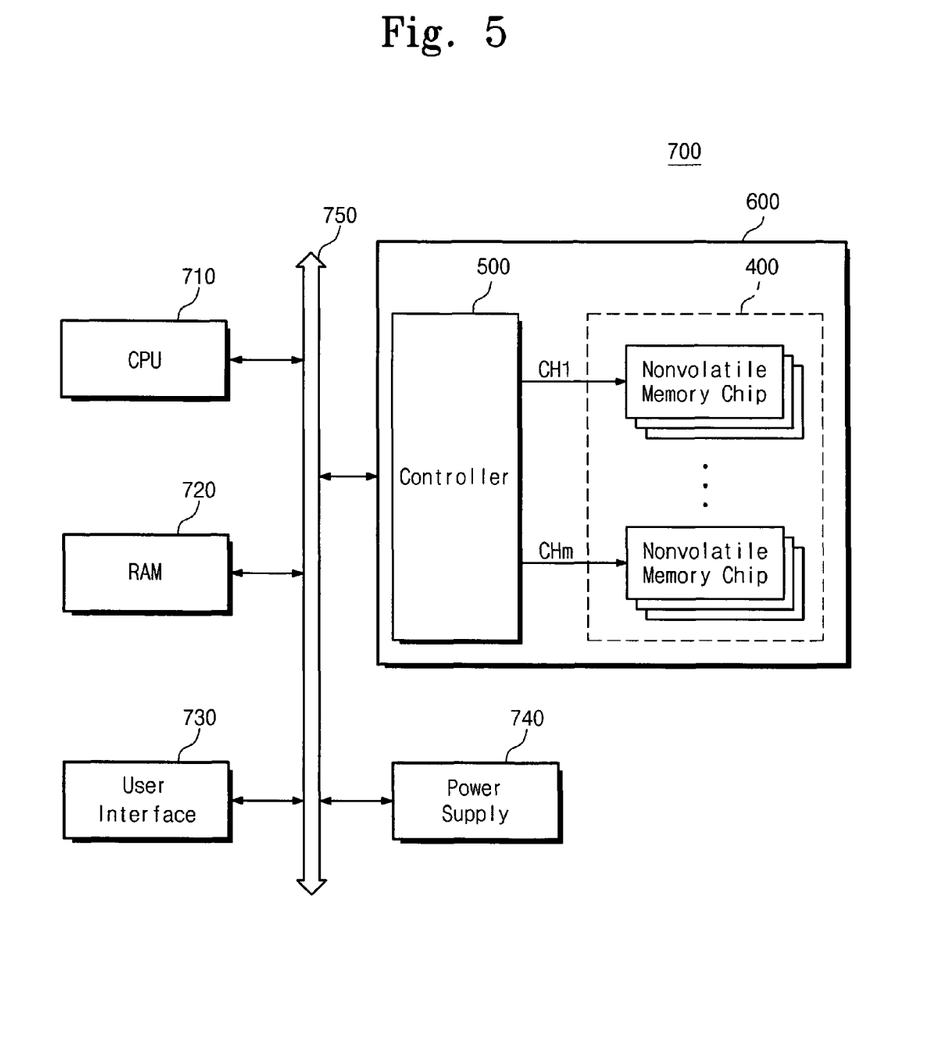
FIG. 5 illustrates a block diagram of an exemplary embodiment of a computing system including the memory system of FIG. 4.

Referring to FIG. 5, the memory system 600 may include a controller 500 and a nonvolatile memory device 400. The nonvolatile memory device 400 may include a plurality of nonvolatile memory chips. The nonvolatile memory chips may be divided into a plurality of groups. Each group of the nonvolatile memory chips may be configured to communicate with the controller 500 through one channel. FIG. 5 illustrates that the nonvolatile memory chips may communicate with the controller 500 through first to kth channels CH1~CHk. Each nonvolatile memory chip may be configured to operate, e.g., in the same way as described above with reference to FIGS. 1A, 1B and 2.

FIG. 5 illustrates a block diagram of an exemplary embodiment of a computing system 700 including the memory system 600 of FIG. 4.

Referring to FIG. 5, the computing system 700 may include a central processing unit (CPU) 710, a random access memory (RAM) 720, a user interface 730, a power supply unit 740, and a memory system 600.

The memory system 600 may be electrically connected through a system bus 750 to the CPU 710, the RAM 720, the user interface 730, and the power supply unit 740. Data, which are provided through the user interface 730 or processed by the CPU 710, may be stored in the memory system 600. The memory system 600 may include a controller 500 and a nonvolatile memory device 400.

For example, the CPU 710 may be configured to set a portion (e.g., an A3 bit) of an address of the nonvolatile memory device 100. For example, as described with reference to FIGS. 1A, 1B and 2, when the second threshold voltage Vt2 or the third threshold voltage Vt3 is used as the threshold voltage of a multi-level cell during a write operation, the CPU 710 may set a 'H' level at the A3 bit. In such embodiments, when the first threshold voltage Vt1 or the fourth threshold voltage Vt4 is used as the threshold voltage of a multi-level cell during a write operation, the CPU 710 may set a 'L' level at the A3 bit.

During a read operation, the CPU 710 may provide the nonvolatile memory device 100 with an address including the A3 bit set during the write operation. As described with reference to FIGS. 1A, 1B and 2, the nonvolatile memory device 100 may select a read voltage on the basis of the A3 bit. The nonvolatile memory device 100 may perform a read operation on the basis of the selected read voltage.

For example, the nonvolatile memory device 400 may include a plurality of nonvolatile memory chips. The nonvolatile memory chips may be divided into a plurality of groups. Each group of the nonvolatile memory chips may be configured to communicate with the controller 500 through a common channel. In the exemplary embodiment of FIG. 5, the nonvolatile memory chips communicate with the controller 500 through first to mth channels CH1~CHm.

When the memory system 600 is provided as a solid state drive (SSD), the booting speed of the computing system 700 may increase remarkably. Although not illustrated in FIG. 5, those skilled in the art will readily understand that the computing system 700 may further include an application chipset and a camera image processor.

The memory system 600 may be replaced with the memory system 300 of FIG. 3.

In this case, for example, the controller 200 or the CPU 710 may be configured to set a portion (e.g., a A3 bit) of an address on the basis of program data. During a write operation, the nonvolatile memory device 100 may be configured to control a program voltage on the basis of a portion (e.g., a A3 bit) of an address. For example, the nonvolatile memory device 100 may be configured to control a program start voltage, a program voltage variation, and the number of times of program loop execution on the basis of a portion (e.g., a A3 bit) of an address. Herein, it is assumed that a write operation is performed in an incremental step pulse program (ISSP) scheme.

The above description is of exemplary embodiments where memory cells are programmed by four threshold voltages. However, the embodiments are not limited to a nonvolatile memory device including memory cells programmed by four threshold voltages, and a system including such a nonvolatile memory device. For example, one or more features described above may be applied to a nonvolatile memory device including memory cells programmed with four or more threshold voltages, and a system including such nonvolatile memory device.

In embodiments, data may be read by determining the threshold voltage of a multi-level cell with up to two-time voltage applications on the basis of data set in a portion of a multi-level cell selection address. Accordingly, a read time may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for operating a nonvolatile memory device including multi-level cells configured to store at least n logic states, where n is equal to or greater than four, the method comprising:
    selecting at least one read voltage for a read operation based on information set at a portion of an address of the respective one of the multi-level cells; and
    determining multi-level data stored in the respective multi-level cell using the at least one selected read voltage.

2. The method as claimed in claim 1, wherein:
selecting at least one read voltage comprises selecting only one read voltage for the read operation of the respective one of the multi-level cells, and
determining multi-level data comprises determining the multi-level data stored in the respective multi-level cell using the one selected read voltage.

3. The method as claimed in claim 1, wherein:
selecting at least one read voltage comprises selecting only up to n/2 read voltages for the read operation of the respective one of the multi-level cells, and
determining multi-level data comprises determining the multi-level data stored in the respective multi-level cell using the up to n/2 selected read voltages.

4. The method as claimed in claim 1, wherein:
a first voltage interval is between a first threshold voltage and a second threshold voltage, a second voltage interval is between the second threshold voltage and a third threshold voltage, and a third voltage interval is between the third threshold voltage and a fourth threshold voltage, and
selecting at least one read voltage comprises selecting a read voltage from only odd or even ones of the first, second and third voltage intervals based on the information set at the portion of the address of the respective one of the multi-level cells.

5. The method as claimed in claim 4, wherein:
the first logic state corresponds to the first threshold voltage, the second logic state corresponds to the second threshold voltage, the third logic state corresponds to the third threshold voltage, and the fourth logic state corresponds to the fourth threshold voltage, and
the second threshold voltage is greater than the first threshold voltage, the third threshold voltage is greater than the second threshold voltage and the fourth threshold voltage is greater than the third threshold voltage.

6. The method as claimed in claim 4, wherein n is equal to 4.

7. The method as claimed in claim 1, wherein the n logic states correspond to n sequential voltage intervals, respectively, and selecting at least one read voltage comprises only selecting a respective read voltage from one or more of non-neighboring ones of the n sequential voltage intervals.

8. The method as claimed in claim 1, wherein selecting at least one read voltage comprises selecting a read voltage corresponding to a level between the second logic state and the third logic state when a level of the information set at the portion of the address is a first level.

9. The method as claimed in claim 1, wherein selecting at least one read voltage comprises selecting a read voltage corresponding to a level between the first logic state and the second logic state and/or a read voltage corresponding to a level between the third logic state and the fourth logic state when a level of the information set at the portion of the address is a second level.

10. The method as claimed in claim 1, wherein the information set at the portion of the address of the respective multi-level cell corresponds to at least one of a first level and a second level, and when the information is set at the first level selecting at least one read voltage comprises selecting one or more read voltages from a first set of voltage intervals corresponding to the n logic states, respectively, and when the information is set at the second level selecting at least one read voltage comprises selecting one or more read voltages from a second set of voltage intervals corresponding to the n logic states, the first set of voltage intervals being different from the second set of voltage intervals.

11. The method as claimed in claim 1, further comprising:
setting the information at the portion of the address during a program operation based on multi-level data to be programmed, respectively.

12. The method as claimed in claim 11, wherein setting the information at the portion of the address comprises setting the information to a first level when the multi-level data corresponds to the second logic state or the third logic state.

13. The method as claimed in claim 11, wherein setting the information at the portion of the address comprises setting the information to a second level when the multi-level data corresponds to the first logic state or the fourth logic state.

14. The method as claimed in claim 1, wherein the first logic state, the second logic state, the third logic state and the fourth logic state have an ascending order relationship.

15. A nonvolatile memory device, comprising:
a memory cell array including multi-level cells configured to store n logic states, where n is equal to or greater than four;
an address decoder configured to decode addresses selecting the multi-level cells, respectively; and
a read voltage generation circuit configured to provide respective read voltages to the memory cell array,
wherein the read voltage generation circuit selects at least one read voltage based on information set at a portion of the respective address decoded by the address decoder for a respective one of the multi-level cells, and multi-level data stored in the respective multi-level cells is determined based on the at least one selected read voltage.

16. The nonvolatile memory device as claimed in claim 15, wherein n is equal to four.

17. The nonvolatile memory device as claimed in claim 15, wherein each of the multi-level cells is adapted to store 2 bit data.

18. A method for operating a nonvolatile memory device including multi-level cells configured to store at least n logic states, where n is equal to or greater than four, and the n logic states including a first set of logic states and a second set of logic states, the method comprising:
setting information of a first level or a second level at a portion of a respective address selecting a respective one of the multi-level cells when the respective multi-level cell is set with a logic state from the first set or the second set of logic states, respectively;
determining the level of the information set at the portion of the respective address during a respective data read operation; and
reading multi-level data stored in the multi-level cell by applying at least one read voltage selected based on the level of the information set at the respective portion of the address of the respective one of the multi-level cells.

19. The method as claimed in claim 18, wherein:
the first set of logic states of the n-logic states is distinct from the second set of logic states of the n-logic states,
the level of information is one of the first level or the second level, and
a read voltage set corresponding to the one or more read voltages selected when the level of information is at the first level is different a read voltage set corresponding to the one or more read voltages selected when the level of information is at the second level.

20. The method as claimed in claim 18, wherein:
n is equal to four,
setting information comprises setting information to the first level when the respective multi-level cell is set with one of the second logic state or the third logic state and to the second level when the respective multi-level cell is set with one of the first logic state and the fourth logic state, and reading multi-level data comprises applying a read voltage corresponding to a level between the second logic state and the third logic state when the information has the first level and sequentially applying a read voltage corresponding to a level between the first logic state and the second logic state and a read voltage corresponding to a level between the third logic state and the fourth logic state when the information has the second level.

* * * * *